United States Patent
Chiu et al.

(10) Patent No.: US 10,134,946 B2
(45) Date of Patent: Nov. 20, 2018

(54) MANUFACTURING METHOD OF LIGHT-EMITTING DEVICE

(71) Applicant: EPISTAR CORPORATION, Hsinchu (TW)

(72) Inventors: Po-Shun Chiu, Hsinchu (TW); De-Shan Kuo, Hsinchu (TW); Jhih-Jheng Yang, Hsinchu (TW); Jiun-Ru Huang, Hsinchu (TW); Jian-Huei Li, Hsinchu (TW); Ying-Chieh Chen, Hsinchu (TW); Zi-Jin Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/626,993

(22) Filed: Jun. 19, 2017

(65) Prior Publication Data
US 2017/0294553 A1    Oct. 12, 2017

Related U.S. Application Data

(62) Division of application No. 14/796,166, filed on Jul. 10, 2015, now Pat. No. 9,698,303.

(30) Foreign Application Priority Data

Jul. 11, 2014  (TW) .............................. 103124086 A (51) Int. Cl.
*H01L 33/00* (2010.01)
*H01L 33/22* (2010.01)
*H01L 33/10* (2010.01)

(52) U.S. Cl.
CPC .......... *H01L 33/0095* (2013.01); *H01L 33/22* (2013.01); *H01L 33/10* (2013.01)

(58) Field of Classification Search
CPC ...... H01L 33/0095; H01L 33/22; H01L 33/10
See application file for complete search history.

(56) References Cited

U.S. PATENT DOCUMENTS

2007/0111481 A1    5/2007  Tamura et al.
2009/0302428 A1*  12/2009  Sakamoto .......... B23K 26/0057
                                              257/620
(Continued)

FOREIGN PATENT DOCUMENTS

CN            1657220 A      8/2005
CN          101412154 A      4/2009
(Continued)

*Primary Examiner* — Matthew Reames
(74) *Attorney, Agent, or Firm* — Ditthavong & Steiner, P.C.

(57) ABSTRACT

A manufacturing method of light-emitting device is disclosed. The method includes providing an LED wafer comprising a substrate and a semiconductor stack formed on the substrate, wherein the semiconductor stack has a lower surface facing the substrate and an upper surface opposite to the lower surface; providing a first laser to the LED wafer and irradiating the LED wafer from the upper surface to form a plurality of scribing lines on the upper surface; providing and focusing a second laser on an interior of the substrate to form a plurality of textured areas in the substrate; and providing force on the LED wafer to separate the LED wafer into a plurality of LED chips.

12 Claims, 7 Drawing Sheets

(56) References Cited

U.S. PATENT DOCUMENTS

| | | |
|---|---|---|
| 2010/0019251 A1 | 1/2010 | Lee et al. |
| 2010/0140636 A1 | 6/2010 | Donofrio et al. |
| 2011/0204412 A1* | 8/2011 | Sugano ............... H01L 33/0095 257/103 |
| 2011/0312193 A1 | 12/2011 | Abe |
| 2012/0267656 A1 | 10/2012 | Kuo et al. |
| 2013/0153947 A1 | 6/2013 | Lim et al. |

FOREIGN PATENT DOCUMENTS

| | | |
|---|---|---|
| CN | 1967783 A | 6/2012 |
| CN | 102513695 A | 6/2012 |

\* cited by examiner

MANUFACTURING METHOD OF LIGHT-EMITTING DEVICE

CROSS-REFERENCE TO RELATED APPLICATIONS

This application is a divisional application of U.S. patent application Ser. No. 14/796,166, filed on Jul. 10, 2015, which claims priority to and the benefit of Taiwan Application Serial Number 103124086 filed on Jul. 11, 2014, which are incorporated by reference in their entirety.

BACKGROUND

Technical Field

The present disclosure relates to a light-emitting diode device and a manufacturing method thereof, more particularly, to a light-emitting diode wafer dicing technology.

Description of the Related Art

Light-emitting diode (LED) is an optoelectronic device composed of p-type semiconductor and n-type semiconductor. LEDs emit light by combination of the carriers on p-n junction and can be widely applied in optical display devices, traffic signals, data storage devices, communication devices, lighting devices and medical instruments. Conventional process of manufacturing LEDs includes forming a semiconductor stack on a substrate by epitaxy process so as to form a wafer. After the epitaxy process, a dicing process is performed to divide the wafer into a plurality of light-emitting diode chips.

Conventional wafer dicing method includes forming two groups of scribing lines which are perpendicular to each other on the surface of the LED wafer, and then performing cleaving process by using a saw along the two groups of the scribing lines to split the wafer into a plurality of LED chips along the scribing lines. However, the yield of the conventional dicing method is degraded when the thickness of substrate increases. Besides, debris or particles generated during the dicing process may easily remain on the LED chip and then absorb light. As a result, light extraction and brightness of the LED deteriorate.

SUMMARY OF THE DISCLOSURE

A method of manufacturing a light-emitting device is disclosed. The method includes: providing a light-emitting diode wafer, comprising a substrate and a semiconductor stack on the substrate, wherein the semiconductor stack has a lower surface facing the substrate and an upper surface opposite to the lower surface; providing a first laser on the light-emitting diode wafer and irradiating the light-emitting diode wafer from the upper surface to form a plurality of scribing lines on the upper surface; providing and focusing a second laser focusing on an interior of the substrate to form a textured area in the substrate; and providing force on the light-emitting diode wafer to separate the light-emitting diode wafer into a plurality of light-emitting diode chips.

A light-emitting diode device is disclosed. The light-emitting diode device includes: a substrate, comprising an upper surface, a lower surface and a plurality of side surface; and a semiconductor stack, formed on the upper surface of the substrate; wherein the plurality of side surface comprises: a first region adjacent to the upper surface and has a first roughness; a second region, comprising one or a plurality of textured areas having a second roughness and substantially parallel to the upper surface and/or the lower surface; and a third region having a third roughness and is between the first region and the second region and/or between the plurality of textured areas; wherein the first roughness is not greater than the second roughness, and the third roughness is smaller than the first roughness.

DETAILED DESCRIPTION OF THE EMBODIMENTS

Reference is made in detail to the preferred embodiments of the present application, examples of which are illustrated in the accompanying drawings. Wherever possible, the same reference numbers are used in the drawings and the description to refer to the same or like parts.

Figure 1A:
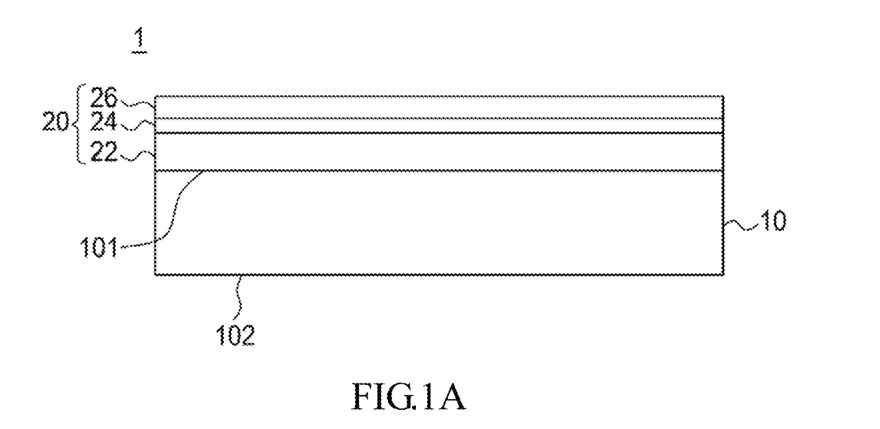
FIGS. 1A~1F show a manufacturing method in accordance with one embodiment of present disclosure.

FIG. 1A shows a manufacturing method for light-emitting diode chip in accordance with one embodiment of the present application. As shown in FIG. 1A, a substrate 10 comprising a first surface 101 and a second surface 102 is provided. A semiconductor stack 20 is formed on the first surface 101 by epitaxy process to form a wafer 1. The substrate 10 can be sapphire, silicon, SiC, GaN or GaAs. The thickness of the substrate 10 is not smaller than 150 μm, and preferably ranges between 150 μm and 250 μm. The semiconductor stack 20 comprises a first semiconductor layer 22, a second semiconductor layer 26 and an active layer 24 interposed between the first semiconductor layer 22 and the second semiconductor layer 26. The first semiconductor layer 22 and the second semiconductor layer 26 have different polarities. The material of the semiconductor stack 20 comprises at least one element selected from the groups composed of Al, Ga, In, N, P, As and Si, such as a compound semiconductor like AlGaInP, MN, GaN, AlGaN, InGaN or AlInGaN. The structure of the active layer 24 can be single heterostructure (SH), double heterostructure (DH), double-side heterostructure (DDH) or multi-quantum well (MQW) structure.

Figure 1B:
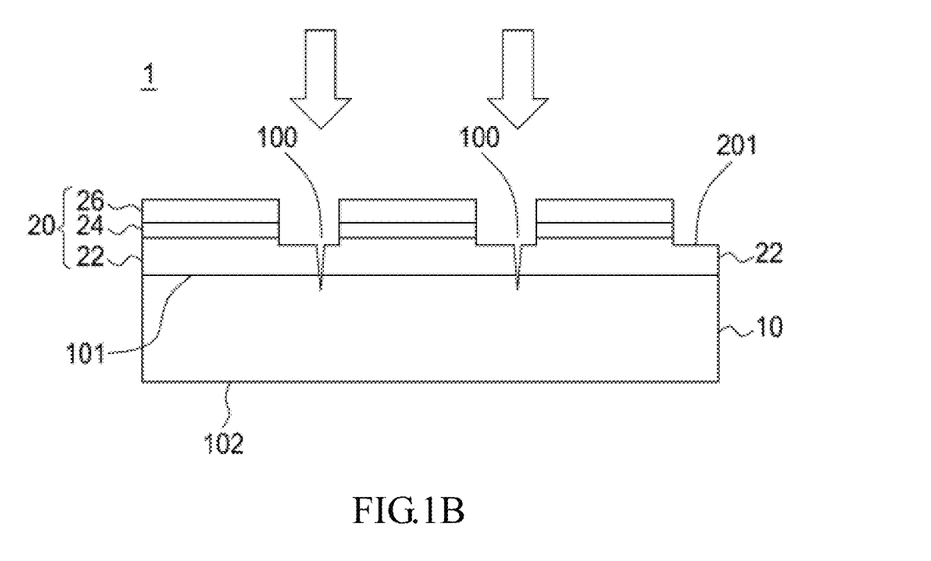
Figure 1C:
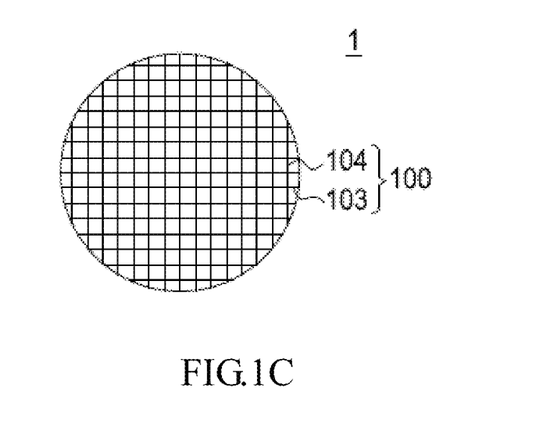
Figure 1D:
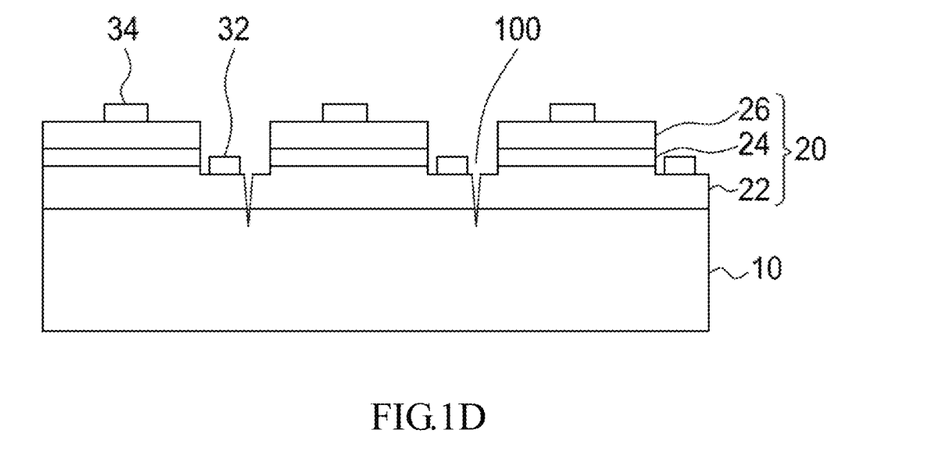
Figure 1E:
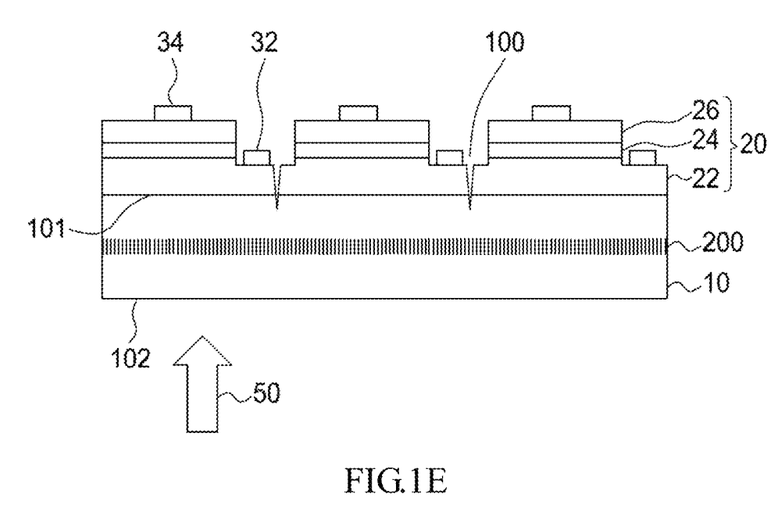

Next, as shown in FIG. 1B, a part of the second semiconductor layer 26 and the active layer 24 are removed to expose the first semiconductor layer 22 by etching process. A plurality of platforms 201 is formed accordingly. Then, irradiating a surface of the first semiconductor layer 22 by a first laser to form a plurality of scribing lines 100 on the surface of the wafer 1. The scribing lines 100 cut through the semiconductor stack 20 with a depth into the substrate 10. FIG. 1C shows a top view of the wafer 1 after being irradiated by the first laser. The scribing lines 100 comprise a plurality of first scribing lines 103 and a plurality of second scribing lines 104. The first scribing lines 103 and the second scribing lines 104 are substantially perpendicular to each other due to the arrangement of the plurality of platforms 201. Next, as shown in FIG. 1D, a current blocking layer (not shown), a current spreading layer (not shown), a first electrode 32 and a second electrode 34 are formed on the semiconductor stack 20. Then, as shown in FIG. 1E, a second laser 50 is applied on the second surface 102 of the substrate 100 along the scribing lines 100. The second laser 50 focuses on the interior of the substrate 100 so as to form textured area 200 with a strip shape in the substrate 100 corresponding to the scribing lines 100. The second laser can be stealth dicing laser, and the textured area 200 can be also known as stealth dicing lines. In order to avoid damaging the semiconductor stack 20 by scatter of the laser, a distance between lower surface of the semiconductor stack 20 which faces the first surface 101 and the position in the interior of the substrate 10 on which the second laser focuses as well as the textured area 200 is formed is preferably more than 80 μm.

Figure 1F:
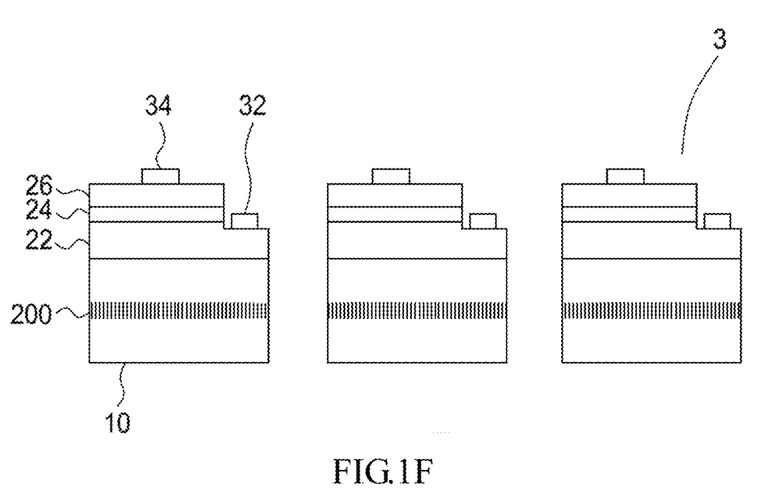

Referring to FIG. 1F, while completing the steps described above, force is applied on the wafer 1 to separate the wafer 1 into a plurality of light-emitting diode chips 3. Debris such as trifles or particles is easily generated on the wafer or the substrate during the first or the second laser dicing process. Once the debris adhered to the upper surface or the side surfaces of the LED chip, light is absorbed and light extraction and brightness in the LED is deteriorated. Thus, a wet-etching process can be performed to remove the debris from the surfaces of the LED chip after the first/second laser scribing process. The wet-etchant can be acid solution, comprising but not limited to Phosphoric acid solution, Sulfuric acid solution or a combination thereof.

Figure 2:
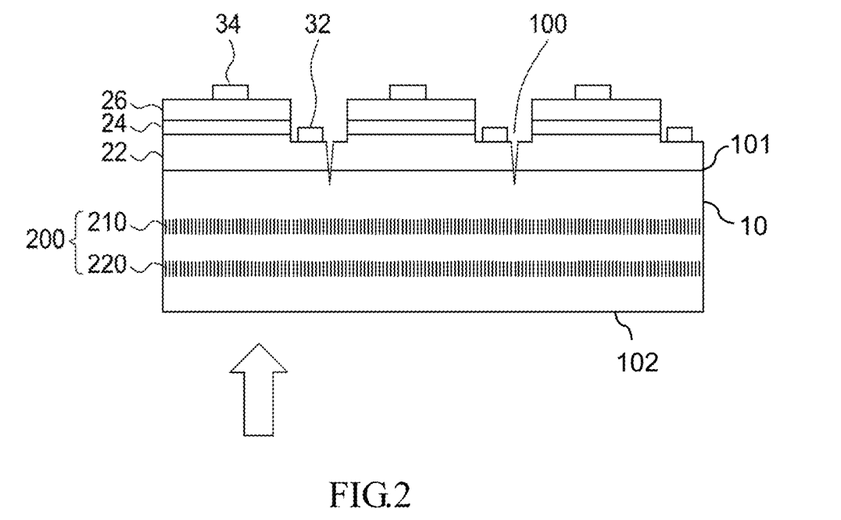
FIG. 2 shows a manufacturing method in accordance with another embodiment of present disclosure.

FIG. 2 shows a manufacturing method for a light-emitting diode chip in accordance with another embodiment of the present application. In this embodiment, a thicker substrate 10 is used to increase light extraction area and light extraction angle in the LED chip. The epitaxy process, the first and second laser scribing processes are the same as the previous embodiment, and are not illustrated here again. When the thickness of substrate is increased, the stealth dicing laser can be repeatedly performed on the second surface 102 of the substrate 10 along the scribing lines 100 to form several different textured areas 210 and 220 on the same cross section inside the substrate 10. For example, the repeated stealth dicing lasers can focus on interior of the substrate with a deeper depth (i.e. the position which is more close to the semiconductor stack 20) in advance, and the following stealth dicing laser focuses on interior of the substrate with a shallower depth (i.e. the position which is more far away from the semiconductor stack 20). These stealth dicing lasers can be performed sequentially, and it also can be performed once to simultaneously form two textured areas. However, practicing the stealth dicing lasers disclosed in these embodiments is not limited to what described above. Next, as described in the previous embodiment, force is applied on the wafer to separate it into a plurality of LED chips after performing the repeated stealth dicing lasers. The plurality of textured areas can guide the splitting direction in the wafer during the following cleaving process. It makes the wafer split vertically along the stress direction of dicing rather than along the lattice direction which cracks easily. The distance of oblique crack is reduced and the yield can be improved. The number of cycles of performing the stealth dicing lasers depends on the thickness of the substrate. The number of cycles is not greater than a value rounded up to integer of (thickness of the substrate −100) μm/50. For example, when thickness of the substrate is about 150 μm to 200 μm, the stealth dicing laser can be repeatedly performed no more than twice; when thickness of the substrate is about 200 μm to 250 μm, the stealth dicing laser can be repeatedly performed no more than three times, and so on. For a thicker substrate, when the number of cycles of performing the stealth dicing laser is insufficient, the yield is deteriorated. For certain thickness of the substrate, if the stealth dicing laser is performed for too many cycles, the cost is increased, and the accumulated laser energy scatters into the semiconductor stack and causes damages. The electrical characteristic of the LED chip is therefore degraded and adverse effects such as the increase of leakage current may occur.

In another embodiment of manufacturing method for light-emitting diode chip of the present application, similarly, the wafer with a substrate which has thickness not smaller than 150 μm is irradiated by the first laser, and repeated stealth dicing lasers are applied to the second surface of the substrate. In order to avoid the semiconductor stack being damaged by the scattering from the laser, the power of the stealth dicing laser which focuses on an interior position of the substrate more close to the semiconductor stack 20 is smaller than that of the stealth dicing laser which focuses on an interior position of the substrate more far away from the semiconductor stack 20; the dicing speed of the stealth dicing laser which focuses on a position more close to the semiconductor stack 20 is faster than the dicing speed of the stealth dicing laser which focuses on other position of the substrate more far away from the semiconductor stack 20. That is, when practicing the stealth dicing laser at the position of the substrate which is close to the semiconductor stack 20, a laser with low power and high speed is applied. In one embodiment, the power of the stealth dicing laser ranges from 0.05 Watt to 0.15 Watt, and the dicing speed ranges from 400 mm/sec to 1000 mm/sec.

Figure 3:
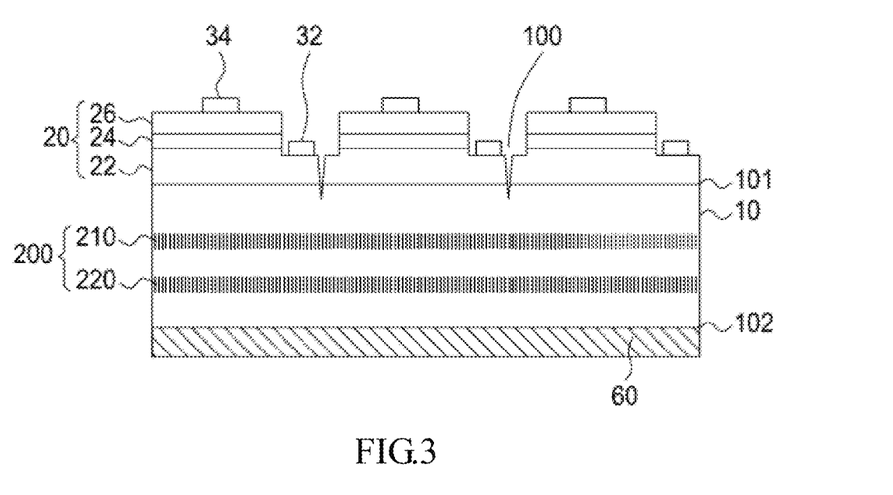
FIG. 3 shows a manufacturing method in accordance with another embodiment of present disclosure.

FIG. 3 shows a manufacturing method for light-emitting diode chip in accordance with another embodiment of the present application. In this embodiment, after performing the stealth dicing laser, a reflective structure 60 is formed on the second surface 102 of the substrate 10 so as to reflect light emitted from the semiconductor stack 20 and improve light extraction of the LED chip, and then the following chip separation process is performed. The material of the reflective structure 60 can be metal, such as Cu, Al, Sn, Au, Ag, Pb, Ti, Ni, Pt, W or alloy thereof. The reflective structure 60 can also be a distributed Bragg reflector (DBR) formed by alternately stacking two or more layers with different refractive indexes. The distributed Bragg reflector can be insulating material or conductive material. The insulating material comprises polyimide, BCB, PFCB, MgO, SU8, epoxy, acrylic resin, COC, PMMA, PET, PC, polyetherimide, fluorocarbon polymer, silicone, glass, $Al_2O_3$, $SiO_x$, $TiO_2$, $SiN_x$, SOG, or TOES. The conductive material comprises ITO, InO, SnO, CTO, ATO, AZO, ZTO, GZO, AlGaAs, GaN, GaP, or IZO. The reflective structure 60 can also be an omnidirectional reflector (ODR) formed by dielectric layers and metal layers.

Figure 4:
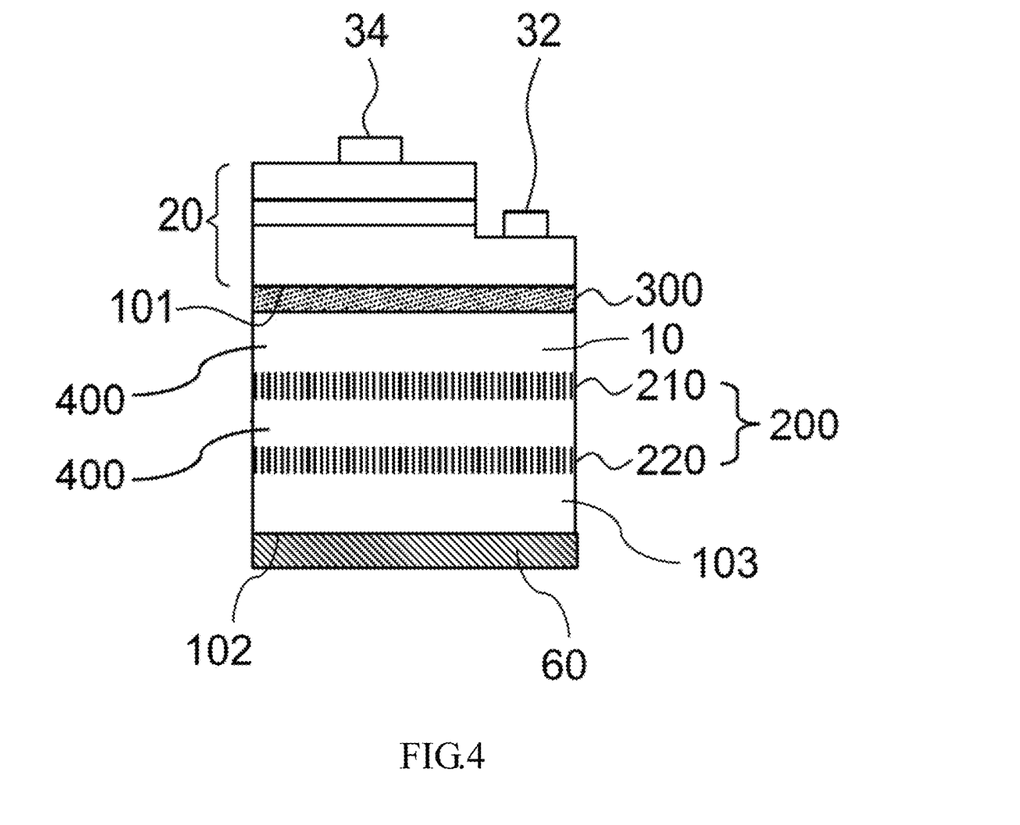
FIG. 4 shows a cross-sectional view of a light-emitting device in accordance with one embodiment of present disclosure.

FIG. 4 shows a structure of an LED chip formed by the manufacturing method of the present application. The LED chip comprises a substrate 10 having a first surface 101, a second surface 102 and a plurality of side surfaces 103, and a semiconductor stack 20 disposed on the first surface 101. The thickness of the substrate is not smaller than 150 μm and preferably ranges between 150 µm to 250 µm. The plurality of side surfaces 103 comprises a first region 300 and a second region 200 which has one or more textured areas 210/220 substantially parallel to the first surface 101 or the second surface 102, and a third region 400 between the first region 300 and the second region 200 and/or between the plurality of textured areas 200. The first region 300 is formed by applying the first laser to scribe the substrate with a depth, and it is located on the side surface 103 near the semiconductor stack 20. The first region 300 has a first surface roughness (can be measured by parameter $R_{RMS}$, root mean square). The one or more textured areas 210/220 in the second region 200 are formed by applying one or more repeated second lasers and therefore are also known as stealth dicing lines. Each of the textured areas 210/220 on the side surface has a second surface roughness. The third region 400 is the splitting surface of the substrate and has a third surface roughness. In one embodiment, the first surface roughness ($R_{RMS}$) of the first region 300 is not greater than 1 µm, the second surface roughness ($R_{RMS}$) of the textured areas 210/220 in the second region 200 ranges from 1 µm to 5 µm, and the third surface roughness ($R_{RMS}$) of the third region 400 is smaller than the first and the second surface roughness. Furthermore, a reflective structure 60 can be disposed on the second surface 102 of the substrate 10 to enhance light extraction efficiency of the LED chip.

Figure 5A:
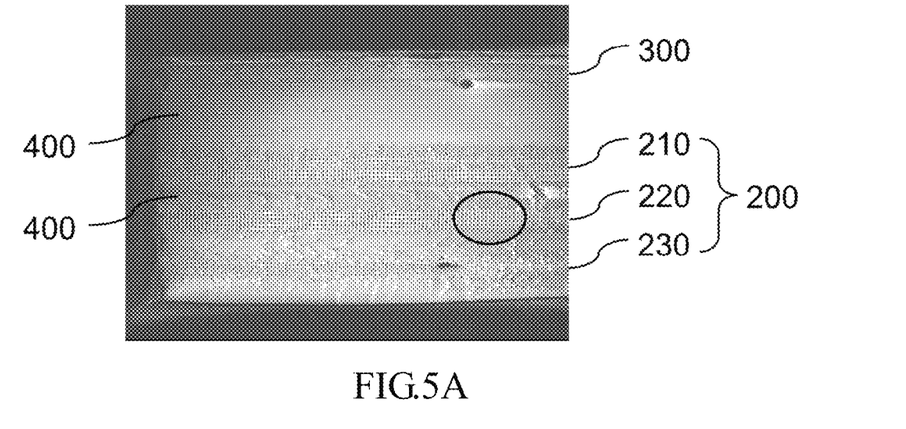
FIGS. 5A and 5B show Scanning Electron Microscope (SEM) images of side surface of the light-emitting device in accordance with one embodiment of present disclosure.
Figure 5B:
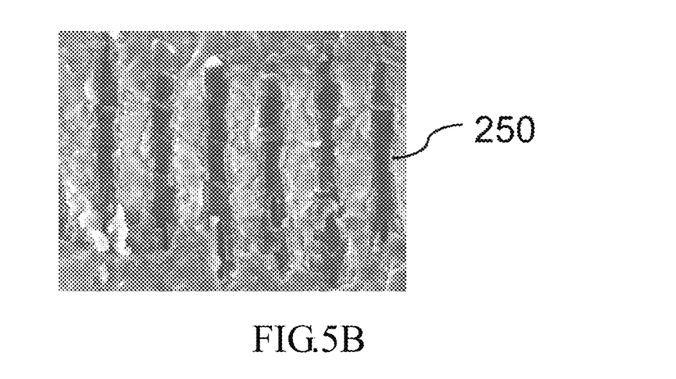

FIG. 5A shows a Scanning Electron Microscope (SEM) image of lateral surface of the LED chip formed by the manufacturing method in accordance with one embodiment of the present application. The side surface comprises the first region 300 adjacent to the semiconductor stack, the second region 200 comprising the plurality of textured areas 210/220/230, and the third region 400. FIG. 5B shows a partial enlargement of the textured area 220 in FIG. 5A. Each textured area is composed of a plurality of textured stripes 250 which are substantially perpendicular to the first surface and/or the second surface of the substrate 10. In one embodiment, the width of one textured area 210/220/230 on the side surface of the substrate (i.e. the length of one textured stripe 250) is smaller than 60 µm, and the distance between one of the textured areas 200 and lower surface of the semiconductor stack 20 is not smaller than 80 µm.

Figure 6:
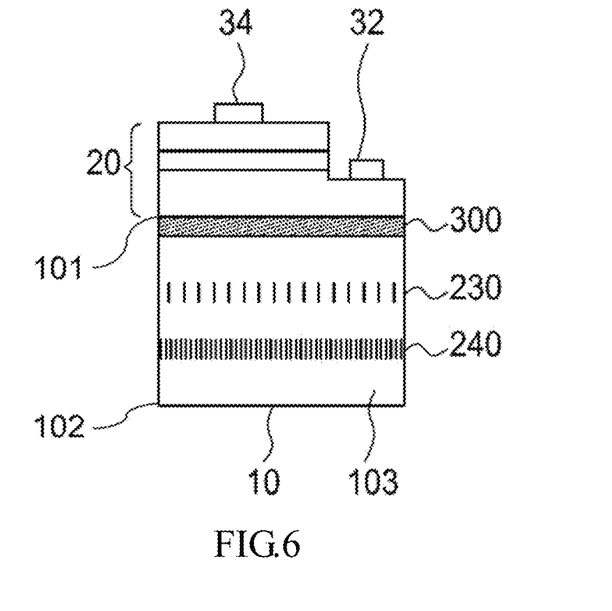
FIG. 6 shows a cross-sectional view of a light-emitting device in accordance with another embodiment of present disclosure.

FIG. 6 shows an LED chip structure formed by the manufacturing method in accordance with one embodiment of the present application. A first textured area 230 is formed on the side surface 103 of the substrate 10 near the semiconductor stack 20. A second textured area 240 is formed on the side surface of the substrate 10 apart from the semiconductor stack. The difference between the LED chips in FIG. 4 and FIG. 6 is that the stealth dicing laser applied in the substrate 10 near the semiconductor stack 20 has lower power and higher dicing speed, so that in FIG. 6, the gap between any two neighboring textured stripes in the first textured area 230 is greater than the gap between any two neighboring textured stripes in the second textured area 240.

Figure 7:
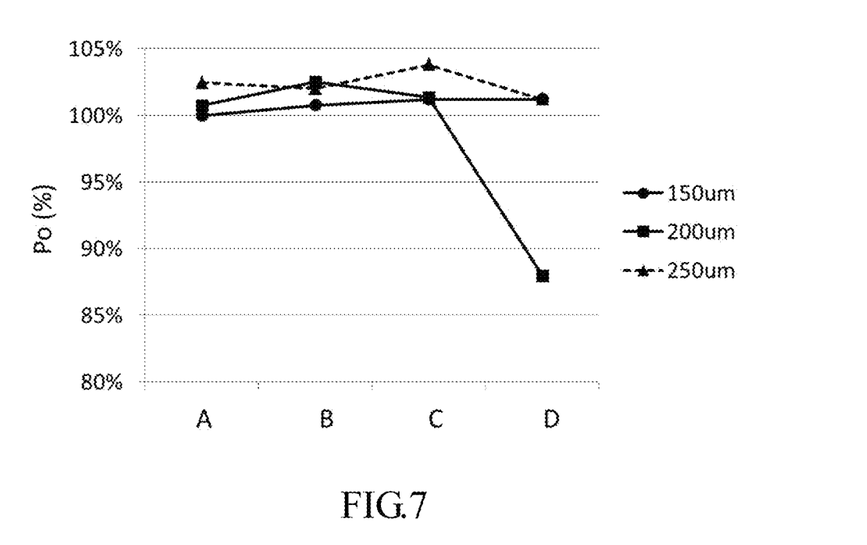
FIG. 7 shows a comparison between measured powers of the LED chips having substrates with different thicknesses in accordance with the manufacturing method of the present disclosure.

FIG. 7 shows a comparison between the measured powers of LED chips having substrate with different thicknesses in accordance with the manufacturing method of the present application. The powers are measured under different dicing conditions. Group A shows a condition which only one laser dicing is applied on a surface of the semiconductor stack, that is, only the first laser dicing is applied; Group B shows a condition which the first laser dicing and a single stealth dicing laser are applied; Group C shows a condition which the first laser dicing and twice stealth dicing laser are applied; Group D shows a condition which the first laser dicing and three times stealth dicing laser are applied. In this experiment, LED chips of the control group are formed by using the first laser to irradiate the wafer having a substrate with a thickness of 150 µm and then splitting it by force and the measured power of the LED chips of the control group is set as 100%. Comparing the measured power of the LED chips formed by each dicing condition with the control group, the power of the LED chips with the stealth dicing laser applying increases more than 0.7%. When thickness of the substrate is 250 µm, the power increases about 4%. When applying laser dicing and three times stealth dicing laser to the LED chip having a substrate with a thickness of 200 µm, the measured power is reduced. The possible reason is the excessive cycles of the stealth dicing lasers cause the semiconductor stack electrical failure.

In the embodiments of present application, the substrate with a thickness not smaller than 150 µm is used to gain more light-extraction area and light-extraction angle. The laser dicing process with once or repeated stealth dicing laser can improve the yield. Besides, the textured areas on the side surface of the substrate can regulate the morphology of lateral of the LED chip, and internal total reflection caused by the smooth surface can be prevented so the light extraction and scattering from the lateral of the chips are enhanced. Thus, light extraction efficiency in whole LED chips is improved.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of manufacturing a light-emitting device, comprising:
   providing a light-emitting diode wafer, comprising a substrate and a semiconductor stack on the substrate, wherein the semiconductor stack has a lower surface facing the substrate and an upper surface opposite to the lower surface;
   providing a first laser on the light-emitting diode wafer and irradiating the light-emitting diode wafer from the upper surface to form a plurality of scribing lines on the upper surface;
   providing and focusing a second laser on an interior of the substrate to form one or a plurality of textured areas in the substrate; and
   providing force on the light-emitting diode wafer to separate the light-emitting diode wafer into a plurality of light-emitting diode chips along the plurality of scribing lines;
   wherein a thickness of the substrate is not smaller than 150 µm and a number of the textured area(s) is N;
   wherein N is not greater than a value rounded up to integer of (thickness of the substrate −100)µm/50; and
   a distance between the lower surface of the semiconductor stack and the textured area which is closest to the semiconductor stack is not smaller than 80 µm.

2. The method of claim 1, wherein after separating the light-emitting diode wafer into the plurality of light-emitting diode chips, a surface roughness parameter $R_{RMS}$ of one of the light-emitting diode chips at the textured area ranges between 1 µm to 5 µm.

3. The method of claim 1, wherein after separating the light-emitting diode wafer into the plurality of light-emitting diode chips, a thickness of the substrate is not smaller than 150 μm.

4. The method of claim 1, wherein the step of providing and focusing the second laser on the interior of the substrate comprises performing the second laser in the substrate one time to form the one textured area, or multiple times to form the plurality of textured areas on the same cross section of the substrate; and wherein the second laser is a stealth dicing laser.

5. The method of claim 4, wherein the step of performing the second laser in the substrate multiple times to form the plurality of textured areas comprises:
    performing a first stealth dicing laser with a first power in the substrate with a first focused position; and
    performing a second stealth dicing laser with a second power in the substrate with a second focused position;
    wherein the first focused position in the substrate is closer to the semiconductor stack than the second focused position, the first power is lower than the second power.

6. The method of claim 5, wherein the first power ranges from 0.05 W to 0.15 W.

7. The method of claim 1, wherein the textured area is substantially parallel to the upper surface and/or the lower surface in a side view, wherein the textured area comprises a plurality of textured stripes.

8. The method of claim 7, wherein after separating the light-emitting diode wafer into the plurality of light-emitting diode chips, the textured area has a width which is smaller than 60 μm along a thickness direction of the substrate.

9. The method of claim 1, further comprising forming a reflective structure on a surface of the substrate opposite to the semiconductor stack.

10. The method of claim 1, further comprising an etching process after providing the first laser.

11. The method of claim 10, wherein the etching process is a wet-etching.

12. The method of claim 1, wherein the first laser cuts through a portion of the semiconductor stack to form the plurality of scribing lines.

* * * * *